(12) United States Patent
Garnett (10) Patent No.: US 7,227,748 B2
(45) Date of Patent: Jun. 5, 2007

(54) COOLING MODULE

(75) Inventor: Paul Jeffrey Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 748 days.

(21) Appl. No.: 10/403,670

(22) Filed: Mar. 31, 2003

(65) Prior Publication Data

US 2005/0259391 A1  Nov. 24, 2005

(51) Int. Cl.
*H05K 7/20* (2006.01)

(52) U.S. Cl. .................... 361/687; 361/695; 700/300; 700/710; 700/302; 714/25

(58) Field of Classification Search ............. 361/687, 361/694–697, 724–727; 454/184; 165/122; 62/259.2; 417/53, 423.14, 423, 523, 423.15; 415/176–178, 213.1; 710/103.1–11, 302, 710/304; 713/1, 2, 100, 104; 714/25, 37, 714/48, 2, 8, 43, 57, 723; 700/70, 299, 300
See application file for complete search history.

(56) References Cited

U.S. PATENT DOCUMENTS

| | | | |
|---|---|---|---|
| 5,432,850 A | | 7/1995 | Rothenberg |
| 5,787,246 A | * | 7/1998 | Lichtman et al. ............ 709/220 |
| 5,809,329 A | * | 9/1998 | Lichtman et al. .............. 710/8 |
| 5,892,973 A | * | 4/1999 | Martinez et al. ............. 710/15 |
| 5,926,386 A | * | 7/1999 | Ott et al. ..................... 700/70 |
| 6,037,732 A | * | 3/2000 | Alfano et al. ............... 318/471 |
| 6,044,423 A | * | 3/2000 | Seo et al. .................... 710/302 |
| 6,236,564 B1 | * | 5/2001 | Fan ............................ 361/695 |
| 6,339,831 B1 | * | 1/2002 | Sugawara et al. ............. 714/3 |
| 6,406,257 B1 | * | 6/2002 | Houdek ..................... 415/213.1 |
| 6,463,550 B1 | * | 10/2002 | Cepulis et al. ................ 714/25 |
| 6,484,128 B1 | * | 11/2002 | Sekiya et al. ............... 702/185 |
| 6,545,438 B1 | * | 4/2003 | Mays, II ..................... 318/254 |
| 6,549,406 B1 | * | 4/2003 | Olesiewicz et al. ......... 361/695 |
| 6,583,989 B1 | | 6/2003 | Guyer et al. |
| 6,597,972 B2 | * | 7/2003 | Emberty et al. ............ 700/304 |
| 6,639,794 B2 | | 10/2003 | Olarig |
| 6,643,128 B2 | * | 11/2003 | Chu et al. .................... 361/687 |
| 6,643,777 B1 | * | 11/2003 | Chu ............................ 726/16 |
| 6,690,576 B2 | * | 2/2004 | Clements et al. ........... 361/695 |
| 6,722,971 B2 | | 4/2004 | Gough |
| 6,725,132 B2 | * | 4/2004 | Frankel et al. .............. 700/300 |
| 6,735,499 B2 | * | 5/2004 | Ohki et al. .................. 700/299 |
| 6,750,562 B2 | * | 6/2004 | Rolls et al. ................... 307/32 |
| 6,810,292 B1 | * | 10/2004 | Rappenecker et al. ........ 700/82 |
| 6,891,347 B2 | * | 5/2005 | Dobbs et al. ............... 318/471 |
| 6,947,281 B2 | | 9/2005 | Wrycraft |
| 6,961,242 B2 | * | 11/2005 | Espinoza-Ibarra et al. .. 361/695 |
| 6,968,470 B2 | * | 11/2005 | Larson et al. ............... 713/340 |
| 2003/0030990 A1 | | 2/2003 | King |
| 2003/0033409 A1 | | 2/2003 | King |
| 2003/0033544 A1 | | 2/2003 | King |
| 2003/0048613 A1 | | 3/2003 | Garnett |
| 2003/0050998 A1 | | 3/2003 | Garnett |
| 2003/0058618 A1 | * | 3/2003 | Soetemans et al. ......... 361/688 |

\* cited by examiner

*Primary Examiner*—Michael Datskovskiy
(74) *Attorney, Agent, or Firm*—Meyertons Hood Kivlin Kowert & Goetzel, P.C.; B. Noël Kivlin (57) ABSTRACT

A cooling module is provided for an electrically powered apparatus. The cooling module comprises a non-volatile memory arranged to store a module identifier code for the module.

4 Claims, 10 Drawing Sheets

COOLING MODULE

BACKGROUND OF THE INVENTION

The present invention relates to cooling modules, and in particular but not exclusively to cooling modules for use with computer systems.

One application for the present invention relates to high-density computer systems, for example, computer server systems for telecommunications applications. In telecommunications applications, it is important to provide high reliability and high capacity operation. Various approaches have been taken to providing such high performance, high reliability systems. The electronic circuitry within computer systems, and particularly processor circuitry, is susceptible to performance to deterioration if it is allowed to operate outside of an ideal temperature range. In some circumstances electronic circuits can even fail due to an excess of heat. To reduce the likelihood of electronic circuitry overheating, it is possible to provide forced cooling by using cooling units. For example, a computer system can comprise electronic circuitry housed in a casing. Typically, the casing includes at least one vent or aperture that can be located towards the rear of the casing, adjacent to which a cooling unit, for example a fan unit, is manned. The fans are operated to drive warmed air heated by the encased electronic circuitry out of the casing, through the vent(s) or aperture(s) and then to the surrounding environment. The casing may also typically incorporate air intake slots or apertures through which cooler air can initially enter the casing.

SUMMARY OF THE INVENTION

Particular and preferred aspects and embodiments of the present invention are set out in the independent and dependent claims.

Viewed from a first aspect, the present invention provides a cooling module for an electrically powered apparatus. The cooling module comprises a non-volatile memory arranged to store a module identifier code for the module. Such a cooling module can allows separate identification of the cooling module within a computer system management structure. Thus the cooling module may be incorporated into an overall service map or scheme of a computer system.

Viewed from a second aspect, the present invention provides a cooling unit for a computer system. The cooling unit comprises mounting parts for physically attaching the cooling unit to the computer system. The cooling unit further comprises a power connection for connecting to a power supply terminal of the computer system and a data connection for connecting to a data interface of the computer system. A memory for storing a module identifier is also present within the cooling unit, and a a data circuit is provided for transmitting the module identifier to the computer system via the data interface. Such a cooling module can allows separate identification of the cooling module within a computer system management structure. Thus the cooling module may be incorporated into an overall service map or scheme of a computer system.

BRIEF DESCRIPTION OF THE DRAWINGS

Embodiments of the present invention will now be described by way of example only with reference to the accompanying drawings wherein like numerals refer to like parts and in which.

While the invention is susceptible to various modifications and alternative forms, specific embodiments are shown by way of example in the drawings and are herein described in detail. It should be understood, however, that the drawings and detailed description thereto are not intended to limit the invention to the particular form disclosed but on the contrary, the invention is to cover all modifications, equivalents and alternatives falling within the spirit and scope of the present invention as defined by the appended claims.

DESCRIPTION OF SPECIFIC EMBODIMENTS

Figure 1:
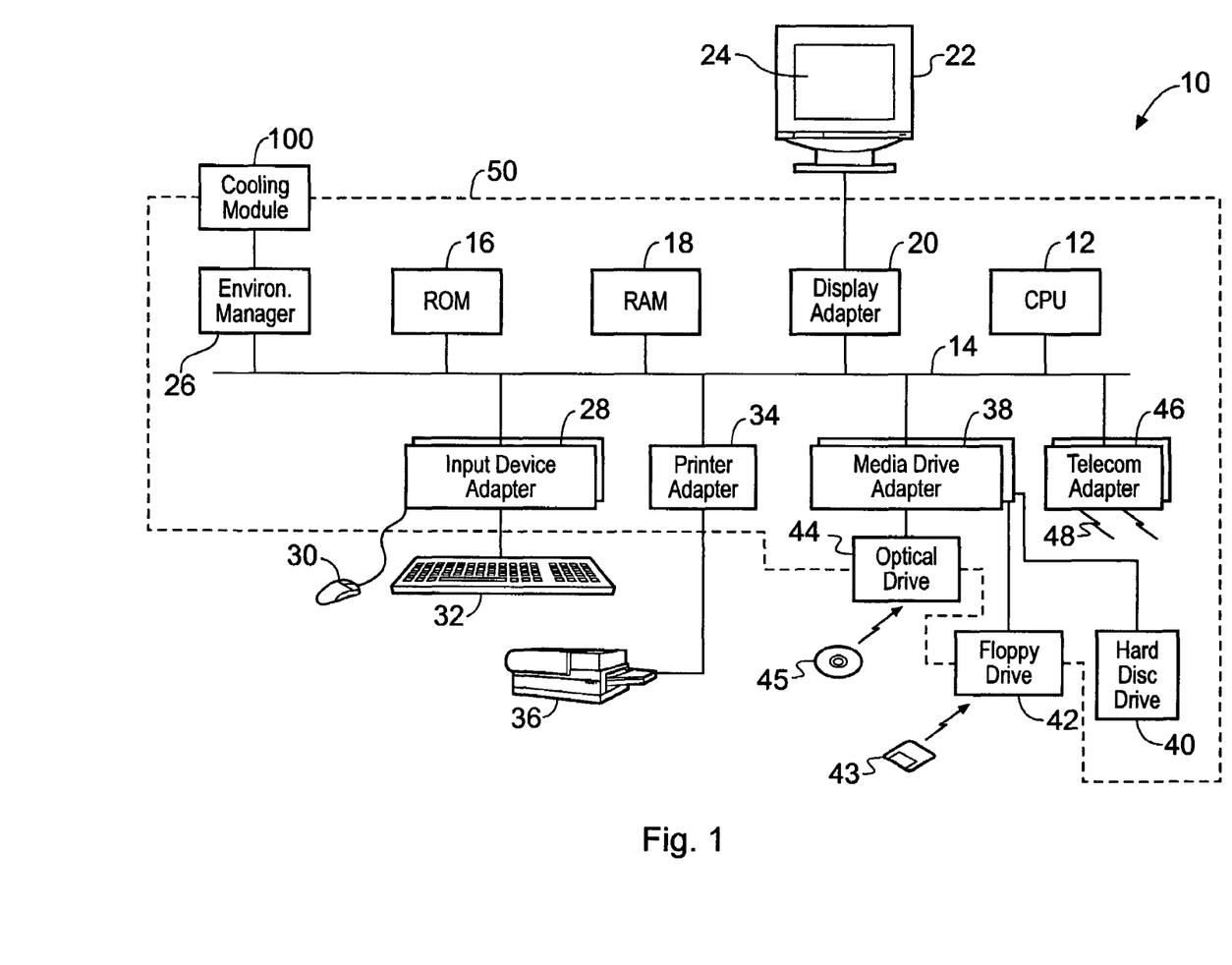
FIG. 1 shows a computer system which can be housed in a casing in which a cooling module can be deployed.

Referring now to FIG. 1, there is shown a schematic and simplified representation of an illustrative implementation of a data processing apparatus in the form of a computer system 10. As shown in FIG. 10 the computer system comprising various data processing resources such as a processor (CPU) 12 coupled to a bus structure 14. Further data processing resources are also connected to the bus structure 14 such as read only memory 16 and random access memory 18. A display adapter 20 connects a display device 22 to the bus structure 14.

Also connected to the bus structure 14 is an input device adapter 28 to which are in turn connected a pointing device 30 such as a mouse and a keyboard 32. The pointing device 30 and the keyboard 32 allow a user of the computer system 10 to provide manual data and control input to the computer system 10. There is also provided a printer adapter 34 connected to the bus structure 14, which printer adapter 34 provides for the output of data from the computer system 10 to the printer 36 to create printed output from the computer system.

For both data storage and transfer, a media drive adapter 38 is provided also connected to the bus structure 14.

Connected to the media driver adapter 38 is a hard disk drive 40 for data storage within the computer system 10. Also connected to the media driver adapter 38 is a floppy disk drive 42 into which removable floppy disks 43 may be inserted to allow for input and export of data to and from the computer system 10. Also provided for data input and export to and from a computer system 10 is an optical disk drive 44 connected to the media drive adapter 38. The optical disk drive 44 may have an optical disk 45 inserted therein for data transfer. The optical drive 44 may be a read-only device such a conventional CD-ROM or DVD drive or it may be a read and writeable device such as a CD-R, CD-R/W or DVD-writeable device. For direct communication into and out of the computer system 10, a telecom adapter 46 is provided attached to the bus structure 14. The telecom adapter 46 communicates with external computing devices using transmitted signals 48. The telecom adapter 46 may be a network interface device such as an Ethernet device or it may be a device configured for a remote communication via a telephone network such as a modem, an ISDN adapter, a DSL adapter or the like. The provision of such a device may allow the computer system 10 to communicate via the Internet (not shown in FIG. 1). The telecom adapter 46 may of course incorporate both the telephone network and LAN communication capabilities.

In the present example, there is also connected to the bus 14 an environment manager 26 that controls a cooling module 100, and provides cooling for the computer system 10.

The environment manager 26 monitors the internal temperature of the computer system 10 within the computer system housing 50 using a temperature sensor and adjusts the cooling effort provided by the cooling module 100 depending upon the measured internal temperature. The environment manager 46 also monitors the tachograph outputs of each cooling unit within the cooling module 100.

There has now been described an example of a computer system 10 which may require assisted cooling of one or more of the components within it.

Figure 2:
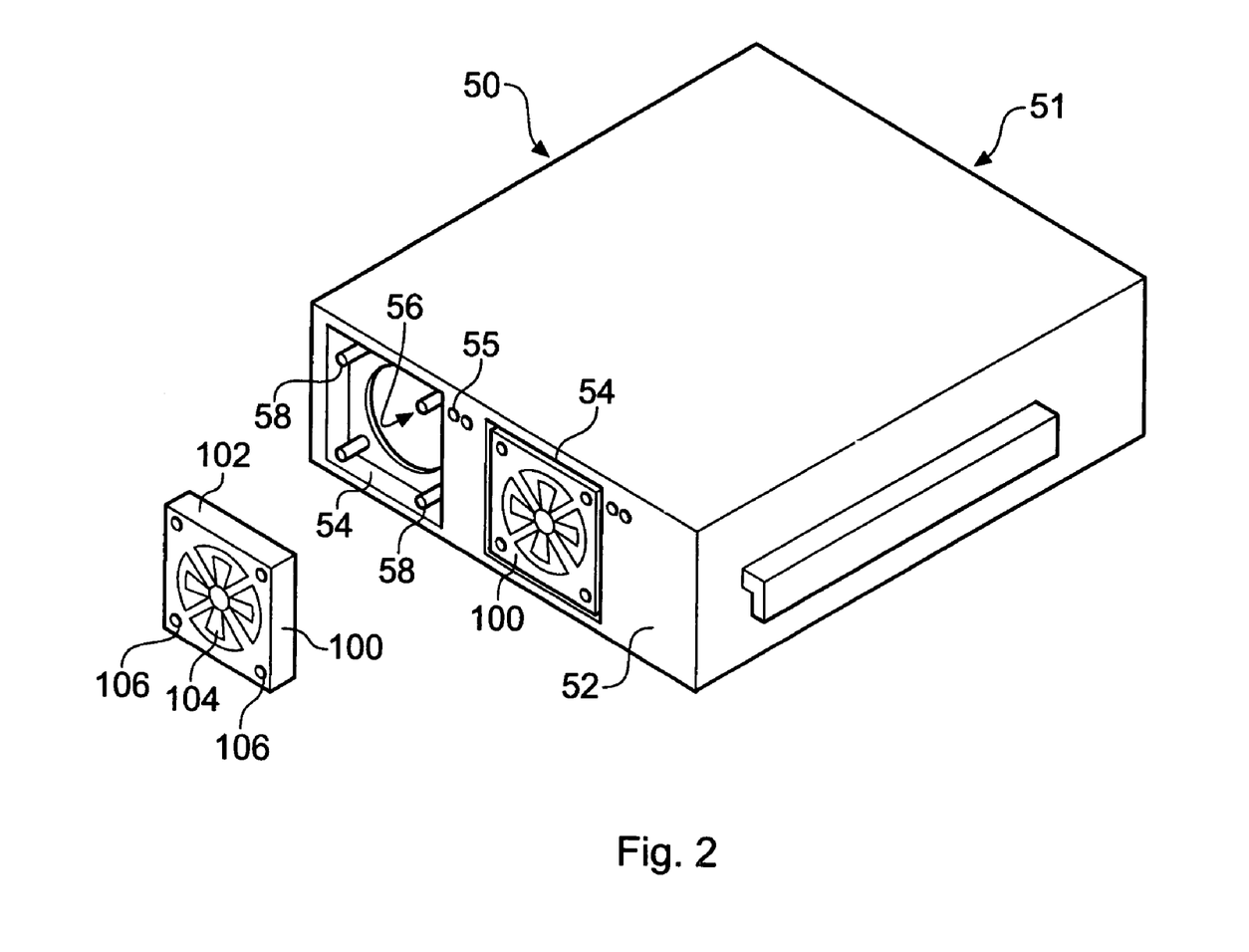
FIG. 2 is a schematic perspective view of a casing housing the computer system of FIG. 1 showing an example mounting arrangement for a cooling module.

With reference to FIG. 2, there is shown an example of a computer system casing 50 having mounted therein an example of a cooling module 100.

The computer system casing 50 has a front face 51 and a rear face 52. The word "front" as used here is merely used as a label herein to refer to the face, or wall of the casing that is located at the main access side of the computer system in use. Similarly the word "rear" are merely used as labels herein to refer to the faces or walls that, in use, are located at those respective locations to the "front".

Within the rear face 52 are formed a pair of cooling module apertures 54. Each cooling module aperture 54 is adapted to receive a single cooling module 100 therein.

Each cooling module aperture 54 has associated therewith a cooling module aperture indicator light 55 which may be used to indicate one or more of the presence of a cooling module within the cooling module aperture 54, a faulty operation of a cooling module within the cooling module aperture 54 and a faulty operation of a cooling module within the cooling module aperture 54. Each cooling module aperture 54 also incorporates a further aperture 56 which constitutes an opening through the rear wall of the casing 50 through which cooling air may be forced by a cooling module 100 received in the cooling module aperture 54. Mounting posts 58 are provided within the cooling module aperture to aid alignment of the cooling module within the cooling module aperture and to facilitate retention of the cooling module within the cooling module aperture.

Each cooling module 100 to be received within a cooling module aperture 54 of the computer system casing 50 comprises a cooling module casing 102 which encloses the parts of the cooling module 100. In the present example, the primary cooling component of the cooling module 100 is a fan 104 which, in use, may be used to drive a flow of air through the computer system casing 50 by forcing air into or out of the casing 50 through the opening 56. The cooling module casing 102 also comprises a number of mounting holes 106 which are configured to interface with the mounting posts 58 when the cooling module 100 is located within the cooling module aperture 54.

As will be appreciated, the mounting arrangements described with reference to FIG. 2 is merely an example of such an arrangement as many other mounting arrangements for mounting a cooling module to a computer system casing may be used. Examples of further mounting arrangements will be given below.

Figure 3:
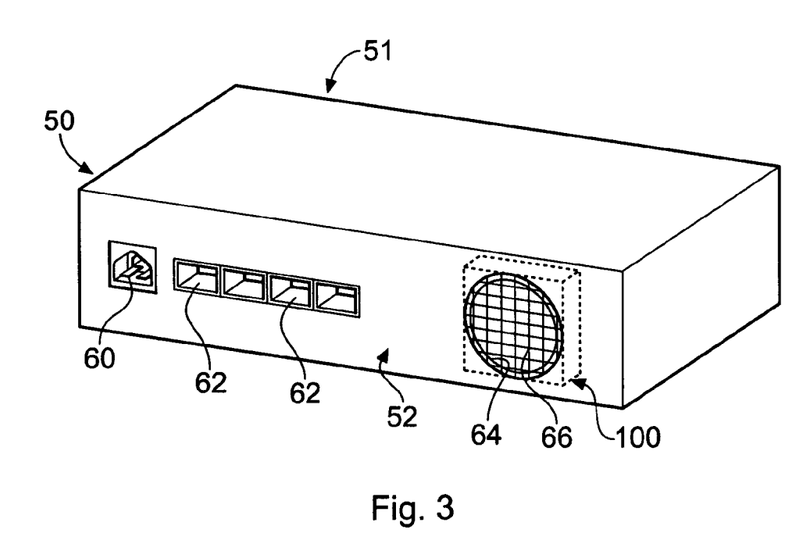
FIG. 3 is a schematic perspective representation of another example of a casing for the computer system of FIG. 1 in which a cooling module is deployed.

FIG. 3 shows an alternative casing 50 for a computer system 10 having mounted therein an example of a cooling module 100. A computer system casing 50 of FIG. 3 has front 51 and rear 52 faces, the words "front" and "rear" used as described above. Within the rear face 52 is aperture 64, which in the present example is covered by a mesh 66. Mounted within the casing 50 against the rear wall 52 at a location corresponding to the mesh 66 covered aperture 64 is a cooling module 100. The casing 50 also has connections against 60 and 62 to permit power and data connections to the computer system 10 respectively.

Figure 4:
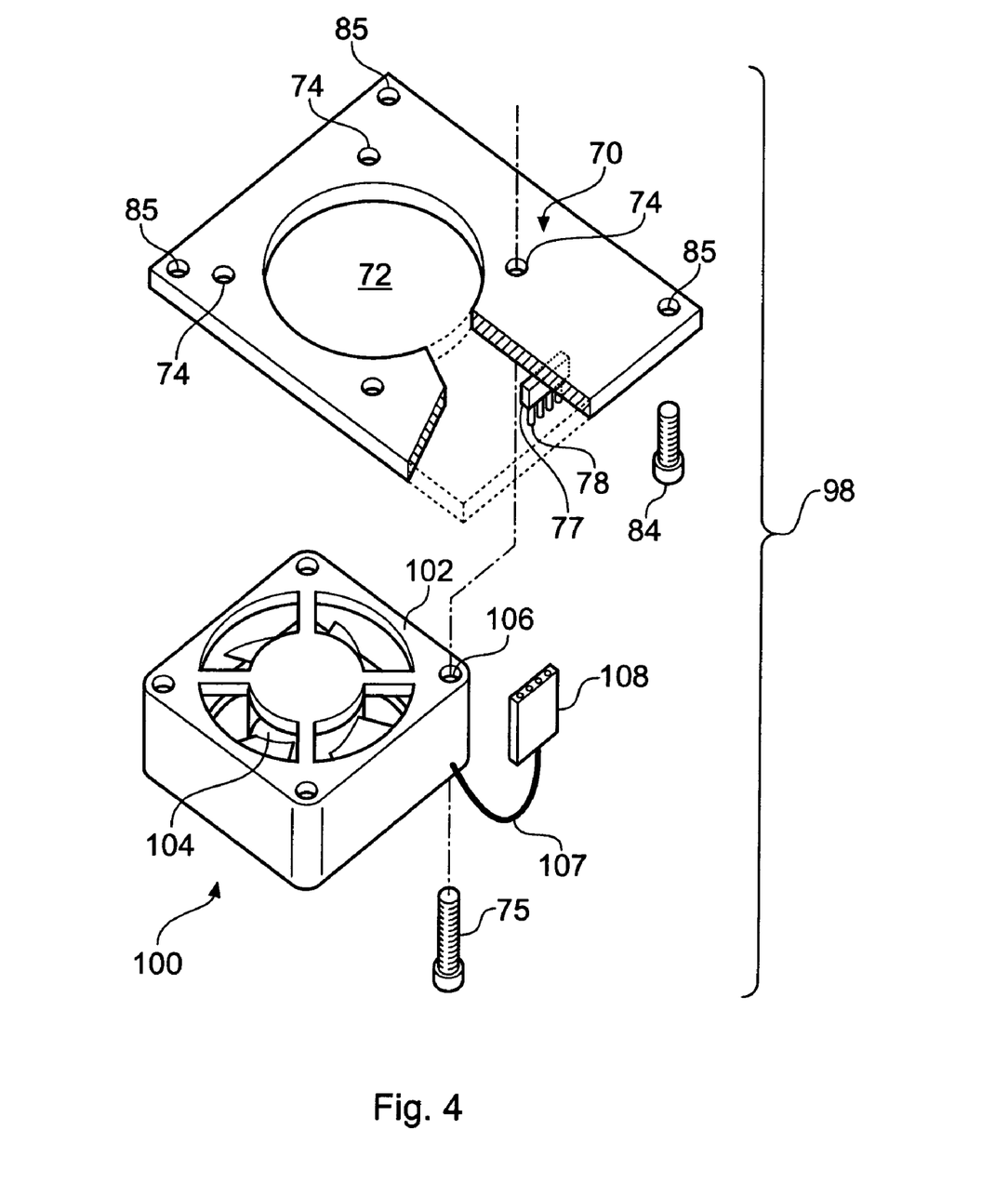
FIG. 4 is a schematic view of a cooling module according to a first example.

Referring now to FIG. 4, there is shown a cooling module assembly 98 according to a first example. The cooling module assembly 98 comprises an electrically powered cooling module 100 comprising an axial flow fan 104 mounted in a module casing 102. Electrical power is supplied to the fan by a flying lead 107 terminating in a connection socket 108. The cooling module 100 is mounted to a computer casing 50 (not shown in FIG. 4) by means of a support structure 70. The support structure 70 has an opening 72 through which air is caused to pass by the fan 104 when in operation. The support structure 70 further comprises a connection plug 77 having pins 78 to connect to the connection socket 108 of the cooling module 100.

In order to provide a fixed relationship between the casing 102 of the cooling module 100 and the support structure 70, mounting holes 106 within the module casing 102 are provided which align with threaded openings 74 in the support structure 70 such that threaded fasteners may be used to secure the module casing 102 to the support structure 70. The support structure 70 is mounted to the computer casing 50 by, for example, threaded fasteners 84 which may be passed through openings 85 in the support structure 70 to provide purchase for securing to the computer 50.

Figure 5:
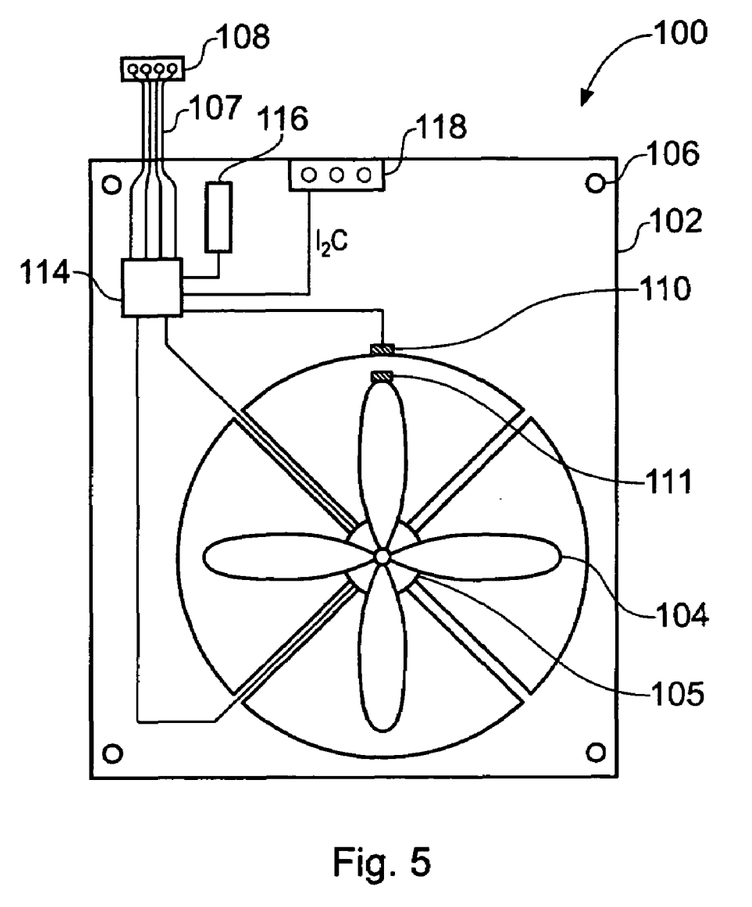
FIG. 5 is a schematic section view through the cooling module of FIG. 4.

With reference to FIG. 5, a schematic section view through the module casing 102 of the cooling module 100 is shown, detailing internal components of the cooling module 100. As can be seen from FIG. 5, the fan 104 is driven by a fan motor 105 which receives power from a pair of power supply leads from a module control IC 114. The module control IC 114 is operable to control the voltage provided to the fan motor 105 to control the speed of rotation of the fan 104. The control IC 114 also receives input from a tachometer sensor 110 for detecting the speed of rotation of the fan 104. In this example, one of the fan blades is provided with a magnetic tip 111 and the tachometer sensor 110 includes a tachometer detector coil that produces an output voltage supply each time the magnetic tip 111 passes. The interval between a series of such spikes is used by the control IC 114 to determine the actual rotational speed of the fan 104.

The control IC 114 is also in communication with a non-volatile memory 116 such as an EEPROM. In some examples, the memory 116 may be incorporated into the control IC 114 and/or can be replaced the control IC 114.

The memory 116 is used to store parameters including at least a field replaceable unit identifier (FRUID). Thus each cooling module 100 may be given a unique identifier such that a computer system management or service processor may include within its management overview of a whole computer system each fan module installed therein. The memory 116 may also be used to store operating and other parameters for the control IC 114. Examples of parameters that can be stored include a part number, a serial number, identification of the place and/or time and date of manufacture, an anticipated fan rotational speed, the number of hours that the fan has been powered on, and/or other operating statistics. The parameters can be read from the memory 116 over control lines, for instance over an I2C bus implemented on conductors forming part of the flying lead 107, by a control processor or other processor in equipment in which the fan module 100 is installed.

In the present example, the control IC 114 also drives a set of FRU indicators 118. These FRU indicators 118 may typically comprise a set of LED's which may be illuminated under control from the control IC 114 to give a visual indication to a service technician or engineer of the operational status of the fan module 100. Typically, the FRU indicators 118 are so located on the module casing 102 that they are visible when the module 100 is in place within a computer system. The FRU indicators 118 may, for example, be operable to indicate a functional status, an error status and a ready for service status. Communication between the cooling module 100 and the computer system in which the module is mounted is effected by a connection through the flying 107 lead and flying lead connection socket 108 which provide external connection wires which feed into the control IC 114. In the present example, four wires are provided within the flying lead 107 and four terminals are present in the connection socket 108 to provide two power lines and two lines operable to provide an I2C bus connection with the computer system.

During operation of the cooling module 100, the control IC may cause to be logged within the memory 116 or to be transmitted via the leads 107 to the computer system within which the cooling module 100 is mounted cumulative operational data of the cooling module 100. This data may include, for example, total powered-on-hours, number of operational revolutions and time since last service action. Alternatively, or in addition, this data can also be read remotely, for example by a control processor in the computer system within which the cooling module 100 is mounted, via the aforementioned 12C bus.

Thus there has now been described a first example of a cooling module for use in a computer system which cooling module has its own unique module identifier to aid in computer system management and which module may be provided with visual indicators of the operational status of the module.

Figure 6:
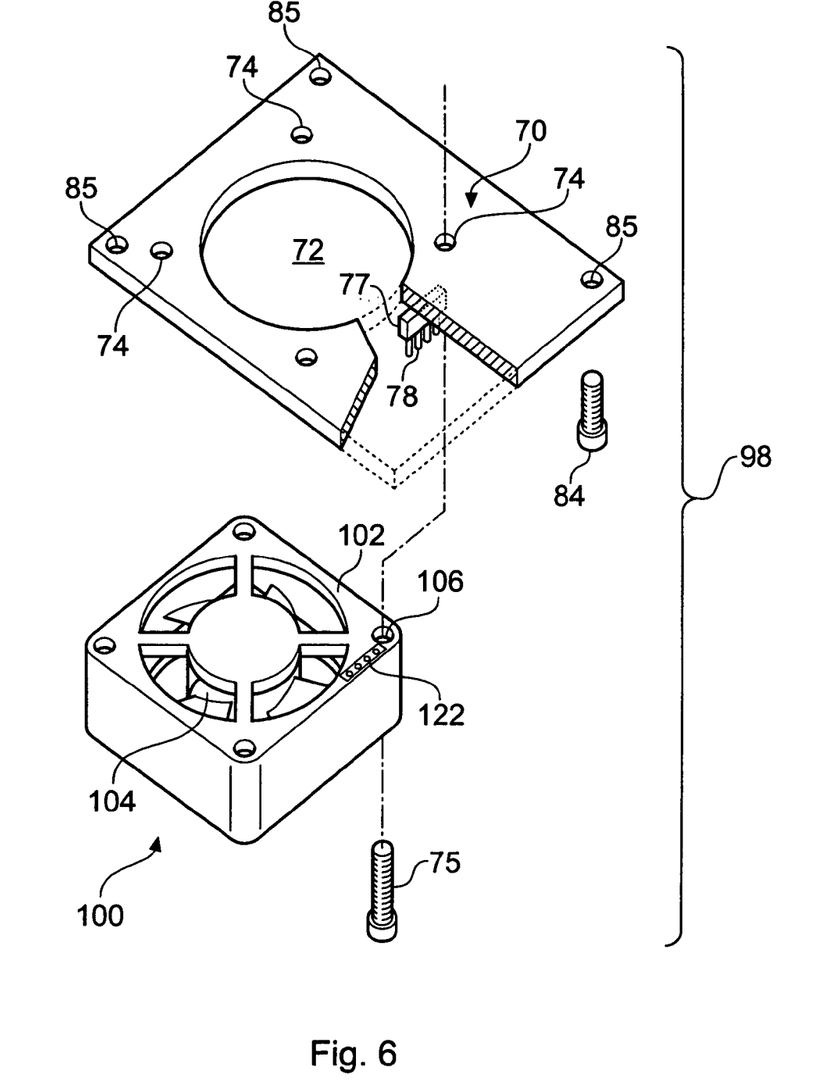
FIG. 6 schematic perspective view of a cooling module according to a second example.
Figure 7:
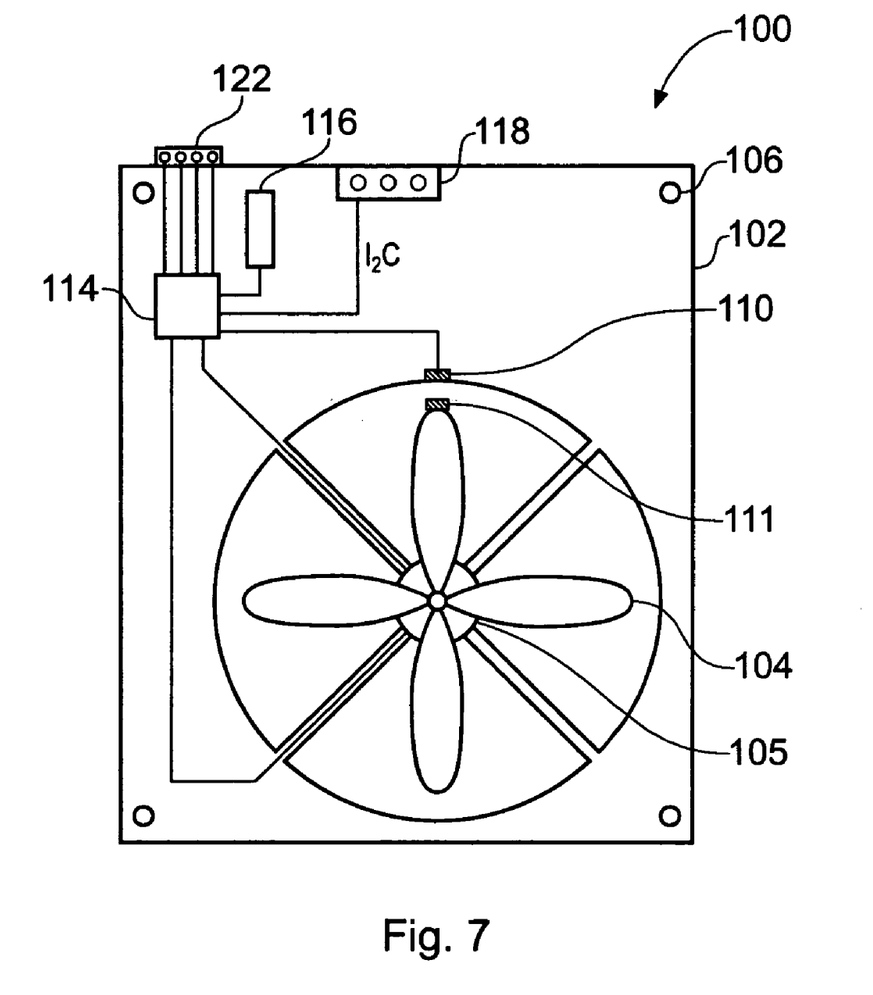
FIG. 7 is a schematic section view through the cooling module of FIG. 6.

With reference to FIGS. 6 and 7, there will now be described a second example of a cooling module 100 in which like parts will be referred to with like reference numerals. Referring to FIG. 6, there is provided, as before as part of a cooling module assembly 98, a cooling module 100 having a casing 102 housing a fan 104 and having mounting holes 106 therethrough. In the present example the module casing 102 has mounted therein an integral connection socket 122 for providing electrical connections to the computer system. The cooling module 100 may be mounted to a support structure 70 which may in turn be mounted to a computer system casing (not shown in FIG. 6). The cooling module 100 may be secured to the support structure 70 using threaded fasteners 75 passing through the mounting holes 106 of the module casing 102 to reach threaded openings 74 in the support structure 70. The support structure 70 has a connection plug 77 and connection pin 78 for connecting to the integral socket 122 and thus the connection plug 77 is so located on the support structure 70 that the pins 78 may enter the connection socket 122 when the mounting holes 106 of the cooling module 100 are aligned with the threaded openings 74 of the support structure 70. This example brings an additional advantage that mounting of the cooling module 100 to the support structure 70 of the computer system is a single stage operation as there is no need to separately mount the cooling module and connect an electrical connector on a flying lead. Thus a service operation of mounting or removing a cooling module 100 onto the support structure 70 is simplified by a halving of the number of tasks required. Also, the reliability of the cooling module 100 may be increased relative to a cooling module having a flying lead connection socket as the module of the present example does not have a relatively delicate flying lead which may be damaged during fixing or removal of the module to the computer system or of the fixing or removal of any other module to the computer system.

With reference to FIG. 7 there is shown a schematic cross section view through the cooling module 100 of FIG. 6 showing internal components thereof. The module 100 comprises within the casing 102 a fan 104 driven by a fan motor 105 and controlled from a control IC 114 which receives a tachometer input from a tachometer sensor 110 which detects the passing of a magnetic tip 111 of one of the fins of the fan 104. The casing 102 also has a number of mounting holes 106 therethrough to provide for mounting of the module 100 to a support structure. The control IC 114 is also in communication with a memory 116 for storage of a FRUID and possibly also other fixed and operational parameters and operational data as discussed earlier. The control IC 114 is also operable to control FRU indicator lights 118 to get a visual indication of the module operational status. Communication between the module 100 and the computer system on which it is mounted is effected via the integral connection socket 122 which provides for electrical connections between the computer system and the control IC 114.

Thus there has now been described a second example of a cooling module for a computer system which module has its own unique module identifier to aid system management and which may have visual indicator lights for indicating its operational status and which may be the subject of a simple module mounting and removal operation.

Figure 8:
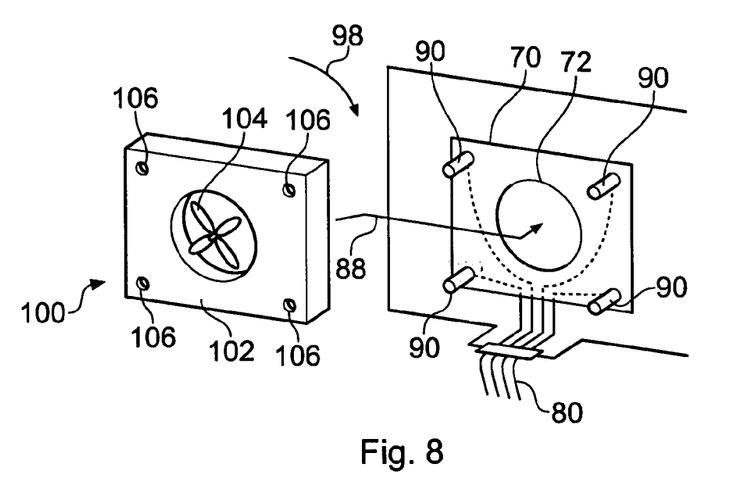
FIG. 8 is a schematic perspective view of a cooling module according to a third example.
Figure 9A:
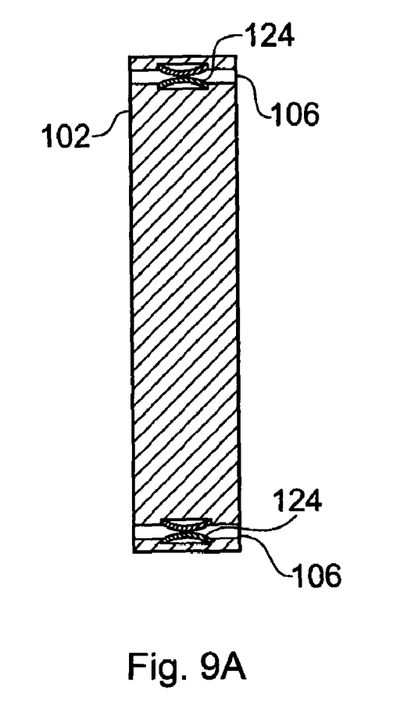
FIG. 9a shows a schematic section view through the cooling module of FIG. 8.
Figure 9B:
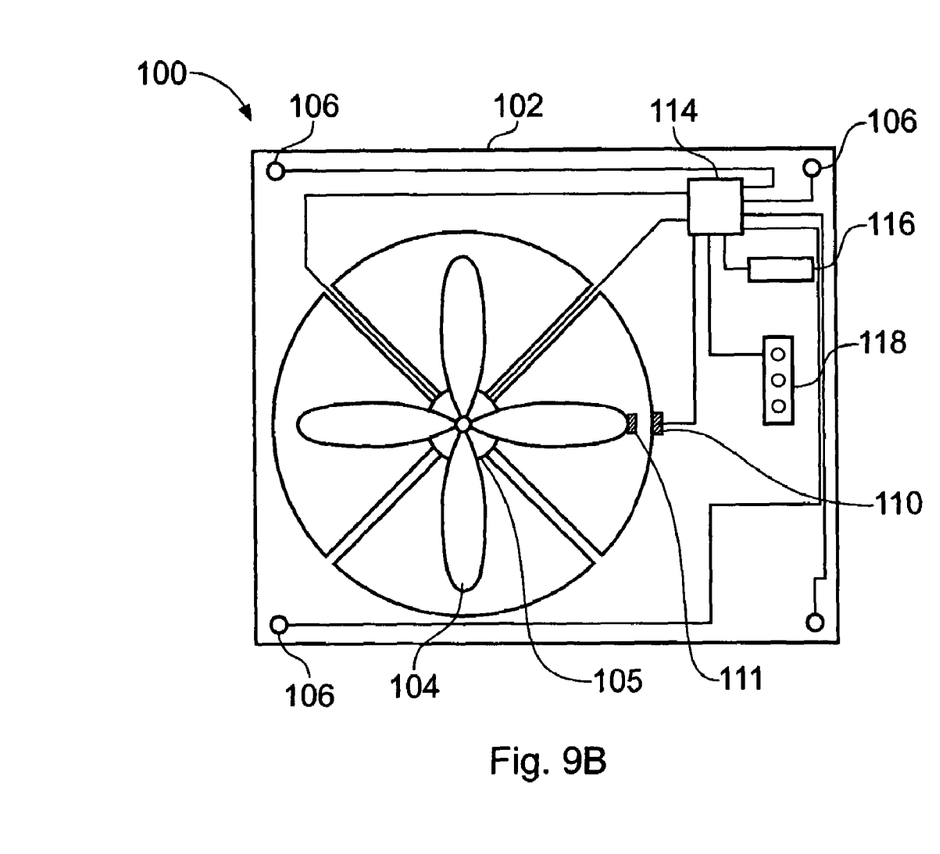
FIG. 9b shows a sectional view orthogonal to the section view of 9a through the cooling module of FIG. 6.

With reference to FIGS. 8 and 9 there will now be described a further example of a cooling module for use in a computer system.

FIG. 8 shows another example of a cooling module 100 having a housing 102 having mounted therein a fan 104 and having therethrough a number of mounting holes 106. The cooling module 100 is adapted for mounting to a support structure 70 as indicated by arrow 88. The support structure 70 has an aperture 72 therethrough and has a number of mounting pins 90, each mounting pin 90 of the support structure 70 being arranged to co-operate with a respective mounting hole 106 of the cooling module 100. In the present example, there is no separate connection socket as electrical connections are effected by an interface between the interior of each mounting hole 106 and each respective mounting pin 90. Electrical connections from each mounting pin 90 are indicated in FIG. 8 by dotted lines leading to a connection 80 which connection 80 is a connection to the electronics of a computer system within which the cooling module 100 is mounted. The connection 80 may be, for example, a fixed connection, a disconnectable socket connection or a cable connection.

Referring now to FIGS. 9*a* and 9*b*, there are shown two schematic cross section views through the cooling module 100 shown in FIG. 8, the view of FIG. 9*b* being orthogonal to the view of FIG. 9*a*. As can be seen from FIG. 9*a*, the module casing 102 has therethrough mounting holes 106. Within each mounting hole 106 is an electrical connector 124. In the present example, the electrical connector 124 of each mounting hole 106 comprises a pair sprung metallic plates arranged such that when a mounting post 90 passes through the mounting hole 106 a firm physical connection is made between the electrical connector 124 and the mounting post 90. As will be appreciated, each mounting post 90 has at least a portion thereof corresponding to the position of the electrical connector 124 having a conductive outer surface in a electrical connection with the electrical connections through the support structure 70 which lead to the electrical connection 80.

As may be seen from FIG. 9*b*, the module 100 has a casing 102 having therein a fan 104 driven by a fan motor 105 under control from a control IC 114. The control IC 114 also receives a tachometer input from a tachometer sensor 110 which detects the passage of a magnetic tip of one of the blades of the fan 104 pass the centre 110. The control IC 114 also communicates with a memory 116 which memory 116 may be used for storage of a FRUID, operational parameters and operational data. The control IC 114 also controls the operation of FRU indicators 118 which may be operated to provide a visual indication of the operational status of the module. As will be appreciated, the module at present for example has no separate electrical connection socket as electrical connections are provided via the mounting holes 106 as described above. Therefore, power and interface connections to the control IC 114 come via those mounting holes 106.

Thus there has now been described is example of a computer system cooling module having a unique module identifier to aid in management of the computer system and which may have module status indicator lights to provide a visual indication of the modules operational status. The module also may be the subject of a simple connection and disconnection operation as no separate electrical connection need be made in addition to the physical mounting of the module to a support structure of the computer system into which it is to be mounted and due to the use of the sprung connections within module there is no requirement for separate fasteners to secure module to the computer system as sufficient purchase may be provided by those sprung fastenings.

Figure 10A:
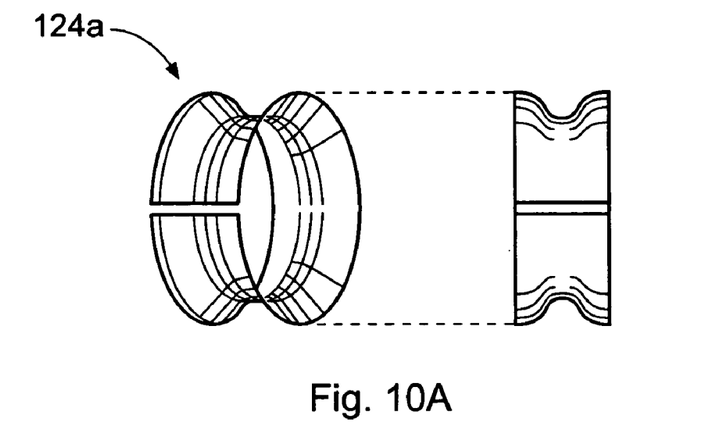
FIG. 10a shows a split-ring connector for use in the coupling of FIG. 9.
Figure 10B:
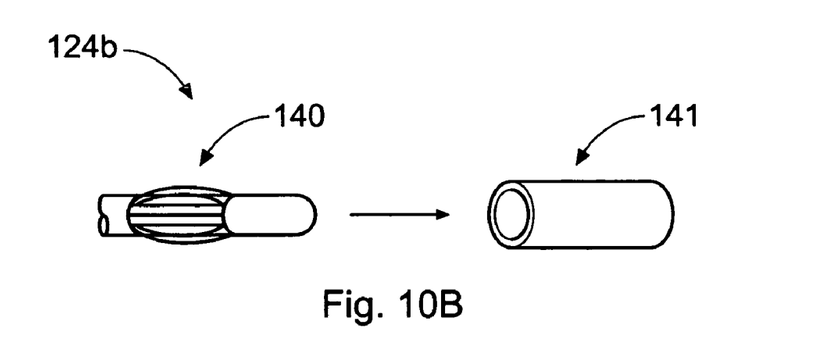
FIG. 10b shows another type of connector arrangement suitable for use in examples of a cooling module.
Figure 10C:
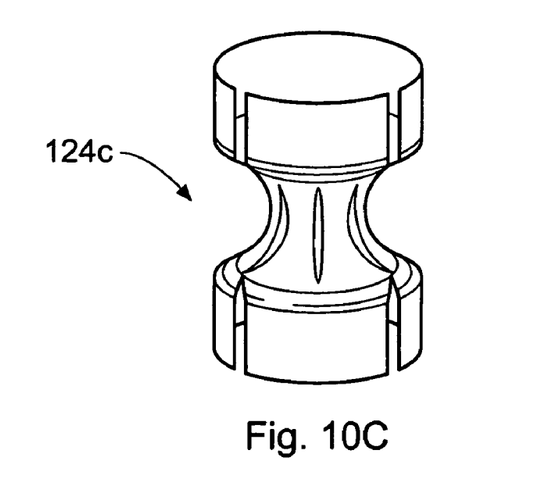
FIG. 10c shows a socket element suitable for incorporating into a connector arrangement for use in embodiments of a cooling module.

With reference now to FIGS. 10*a* to 10*c* there will now be described various alternative electrical and mechanical fastenings for use in connecting a module 100 of the type shown in FIG. 8 to a support structure.

FIG. 10*a* shows a split ring connector 124*a* which may be housed within a mounting hole 106 of a cooling module housing 102. The split ring connector 124*a* as shown in FIG. 10*a* in both perspective and side views, is formed from a flat-surface metal ring deformed at the mid point of its thickness to form a circumferential indentation that projects towards the centre of the ring. The deformed metal ring is then cut to form a split ring connector 124*a*. The split ring connector 124*a* shown in FIG. 10*a* is suitable for providing the necessary mechanical and electrical connection between the module 100 and the mounting posts 90 of the support structure 70.

FIG. 10*b* shows another type of connector arrangement 124*b* that can be used to mechanically and electrically connect a cooling module to a support structure. The connector arrangement 124*b* comprises a female member 141 formed from a conducting cylindrical element. The female member 141 can be formed as an integral part of a support structure or of a cooling module. The connector arrangement 124*b* also comprises a male member 140 that co-operates with the female member 141 to provide mechanical support and an electrical connection therebetween. The male member 140 is attached to either of the cooling unit (where the female member 141 is formed in the support structure) or to the support structure unit (where the female member 141 is formed in the cooling module). The male member 140 carries a resilient expanded metal sleeves that bears against the inside of the female member 141 and provides electrical contact therebetween. A male member of the type shown in FIG. 10*b* may be referred to as a "banana plug".

FIG. 10*c* shows a socket element 124*c* that can be used to mechanically and electrically connect a cooling module to a support structure. The socket element 124*c* comprises a hollow tubular hour-glass shape resilient metal foil having longitudinal slots cut in the central waist portion to provide a resilient electrical contact onto a male rod-like member inserted therein. The upper and lower end portions of the socket element also comprise respective slots to allow the socket element 124*c* diameter to be compressed via insertion into a retaining angular groove formed in either the cooling module or the support structure.

Figure 11A:
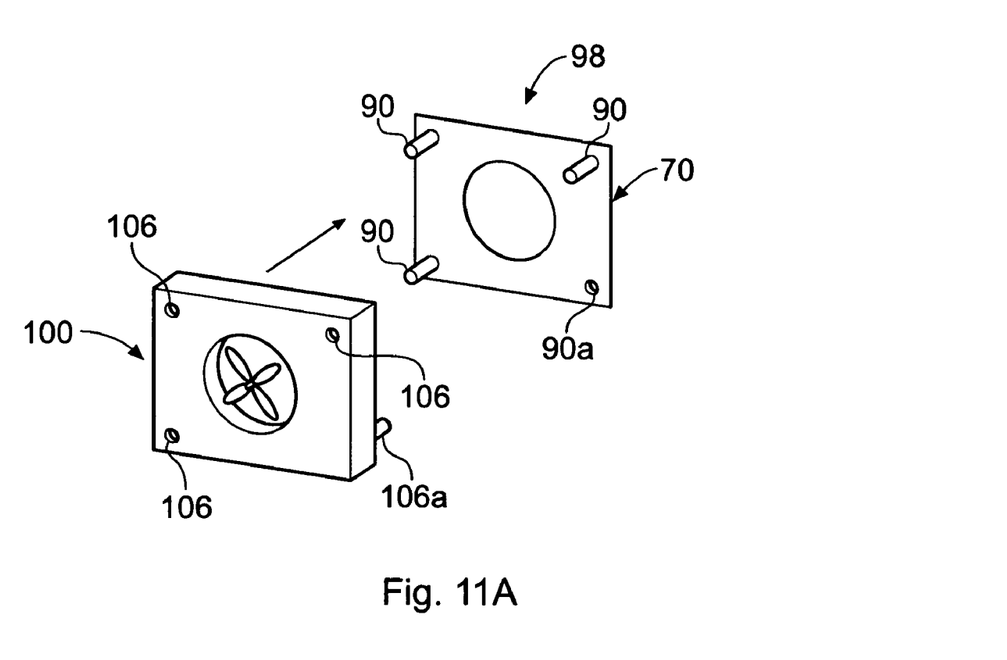
FIG. 11a shows a cooling module assembly according to further example of a cooling module.

FIG. 11*a* shows a cooling module assembly 98 of another example in a simplified fashion. The cooling unit assembly 98 comprises a support structure 70 having one female member (opening or aperture) 90*a* and three male members (mounting posts) 90 to which can be coupled and electrically powered cooling module 100. The electrically powered cooling module 100 has one male member (mounting rod) 106*a* and three female members (mounting holes) 106 that co-operate with respective ones of the one female member 90*a* and the three male members 90 of the support structure 70 to form the connectors that provide both electrical connections and mechanical support for the electrically powered cooling module 100. The cooling module assembly 98 shown in FIG. 11*a* is advantageous in that it helps prevent the electrically powered cooling module 100 from being incorrectly connected to the support structure 70.

Figure 11B:
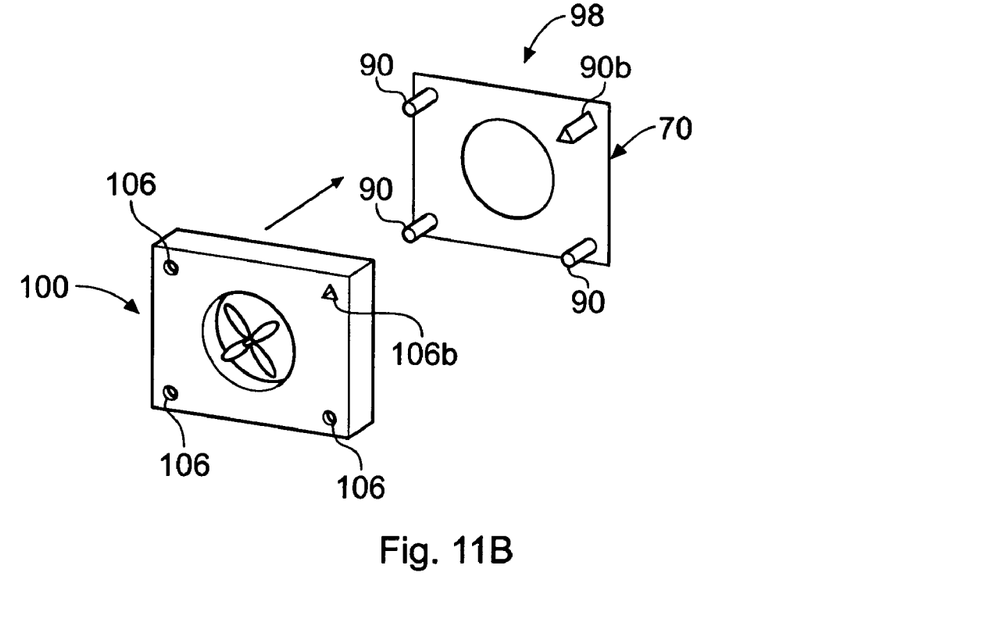
FIG. 11b shows a cooling module according to another example of a cooling module.

FIG. 11*b* shows another example of a cooling assembly 98 in simplified form. The cooling unit assembly 98 comprises a support structure 70 having four male members (mounting posts) 90 which can be coupled to an electrically powered cooling module 100. One of the male members (mounting posts) 90*b* is different shaped in cross-section from the other three male members (mounting posts) 90, in this case three members 90 are all substantially circular cross section and the fourth 90*b* is of substantially triangular cross section. The electrically powered cooling unit 100 has four females (mounting holes) 106 of correspondingly shaped channel cross section that co-operate with respective one of the four male members 90 and 90*b* of the support structure to form connectors that provide both electrical connections and mechanical support for the electrically powered cooling module 100. The cooling unit assembly 98 shown in FIG.

11b is also advantageous in that it helps prevent the electrically powered cooling module 100 from being incorrectly connected to the support structure 70.

Thus there has now been described a number of different examples of electrically powered cooling modules for a computer system which may be easily managed by the computer system into which they are mounted and which may give a visual indication of their operational status on the outer surface thereof. The provision of a non-volatile memory arranged to store at least a module identifier code enables automatic recognition of an installed cooling module to a system in which the module is installed.

It will be immediately apparent to you that the skilled addressee that the above illustrative embodiment and examples show only a limited number of the possible modes by which the present invention may be employed. Many other arrangements and modifications thereto are possible without departing from the present invention.

As will be appreciated, a large number of different mechanical arrangements may be devised for fixing the cooling module to a computer system within which it is to be mounted. These arrangements may include, but are not limited to, the use of threaded fasteners, the use of ridged fasteners, including resilient and non resilient split members, resiliently fitting mounting rods and sprung members such a spring clips. Each cooling module may have a number of cooling elements such as fans to provide to a cooling service.

The scope of the present invention is not to be limited by the above described embodiments and examples but it is to be defined by the appended claims together with their full scope of equivalents.

The scope of the present disclosure includes any novel feature or combination of features disclosed therein either explicitly or implicitly or any generalisation thereof irrespective whether or not it relates to the claimed invention or mitigates any or all of the problems addressed by the present invention. The applicant hereby gives notice that new claims maybe formulated to such features during the prosecution of this application or of any such further application derived therefrom. In particular, with reference to the appended claims, features from dependent claims may be combined with those of the independent claims and features from respective independent claims may be combined in any appropriate manner and not merely in a specific combinations remunerated in the claims.

For the avoidance of doubt, the term "comprising" used in the description and claims should not be construed to mean only "consisting of".

What is claimed is:

1. A cooling module for a computer system, the cooling module comprising:
    a fan;
    a cooling module housing coupled to the fan;
    at least one mounting pin coupled to the housing, wherein the at least one mounting pin is operable to couple the cooling module to the computer system and support the cooling module on a computer system housing;
    an electrical connector integrated in the mounting pin; and
    a rewriteable non-volatile memory inside the cooling module housing and coupled to the electrical connector.

2. The cooling module of claim 1, further comprising a data interface coupled to the electrical connector and to the rewriteable non-volatile memory; wherein the computer system comprises an integrated circuit coupled to the rewriteable non-volatile memory through the data interface.

3. The cooling module of claim 2, further comprising a data circuit for transmitting information stored on the rewriteable non-volatile memory to the computer system via the data interface.

4. The cooling module of claim 2, wherein the rewriteable non-volatile memory is an Electrically Erasable Programmable Read-Only Memory (EEPROM).

* * * * *